(12) United States Patent
Zhang et al.

(10) Patent No.: US 11,694,897 B2
(45) Date of Patent: Jul. 4, 2023

(54) BACKSIDE WAFER DOPANT ACTIVATION

(71) Applicant: Applied Materials, Inc., Santa Clara, CA (US)

(72) Inventors: Qintao Zhang, Mt Kisco, NY (US); Wei Zou, Lexington, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/349,599

(22) Filed: Jun. 16, 2021

(65) Prior Publication Data

US 2022/0406604 A1 Dec. 22, 2022

(51) Int. Cl.
*H01L 21/265* (2006.01)
*H01L 29/66* (2006.01)
*H01L 29/417* (2006.01)

(52) U.S. Cl.
CPC ........ *H01L 21/26513* (2013.01); *H01L 29/41708* (2013.01); *H01L 29/66333* (2013.01)

(58) Field of Classification Search
CPC .......... H01L 29/66333–66348; H01L 29/7395–7398; H01L 21/26513; H01L 29/7393
See application file for complete search history.

(56) References Cited

U.S. PATENT DOCUMENTS

| | | | |
|---|---|---|---|
| 9,768,285 B1* | 9/2017 | Kuruc | H01L 21/324 |
| 2005/0233499 A1* | 10/2005 | Okuda | H01L 24/11 |
| | | | 438/118 |
| 2012/0077331 A1* | 3/2012 | Sameshima | H01L 21/76254 |
| | | | 438/459 |
| 2014/0159150 A1* | 6/2014 | Kirisawa | H01L 29/868 |
| | | | 257/656 |
| 2015/0099350 A1* | 4/2015 | Srinivasan | H01L 21/26546 |
| | | | 438/522 |
| 2017/0133482 A1* | 5/2017 | Shinsho | H01L 29/66348 |
| 2018/0366566 A1* | 12/2018 | Suzuki | H01L 29/861 |
| 2020/0258742 A1* | 8/2020 | Suvorov | H01L 29/0657 |
| 2021/0050344 A1* | 2/2021 | Hosoya | H01L 29/0696 |
| 2021/0398811 A1* | 12/2021 | Kamimura | H01L 29/0688 |
| 2022/0238513 A1* | 7/2022 | Ikeda | H01L 29/66348 |
| 2022/0310829 A1* | 9/2022 | Konishi | H01L 29/7397 |

* cited by examiner

*Primary Examiner* — Wasiul Haider
(74) *Attorney, Agent, or Firm* — KDW Firm PLLC

(57) ABSTRACT

Disclosed herein are methods for backside wafer dopant activation using a high-temperature ion implant. In some embodiments, a method may include forming a semiconductor device atop a first main side of a substrate, and performing a high-temperature ion implant to a second main side of the substrate, wherein the first main side of the substrate is opposite the second main side of the substrate. The method may further include performing a second ion implant to the second main side of the substrate to form a collector layer.

18 Claims, 4 Drawing Sheets

BACKSIDE WAFER DOPANT ACTIVATION

FIELD OF THE DISCLOSURE

The present embodiments relate to semiconductor device patterning, and more particularly, to backside wafer dopant activation using a high-temperature ion implant.

BACKGROUND OF THE DISCLOSURE

An insulated-gate bipolar transistor (IGBT) device generally includes a metal oxide semiconductor field effect transistor (MOSFET) that drives a wide base of a bipolar junction transistor (BJT). Vertical IGBTs have become a key power device for high current and high voltage uses, particularly for motor control and induction heating type applications. Some existing goals for improving vertical IGBTs include reducing the forward collector-emitter voltage drop ($V_{cE-sat}$) and minimizing switching losses.

In some approaches, doping concentrations of the P+ hole injector and the N field stop or N buffer regions of the IGBT may be used to control injection efficiency of the MOSFET into the base of the vertical BJT of the IGBT. Therefore, controlling the doping concentration of a P-type hole injection region that is connected to the collector electrode and an N buffer region can be critical to IGBT device performance. However, doping concentrations in P+ wafers are generally not well controlled.

To reduce doping concentration variations for P-type hole injection and N field stop regions, after completion of IGBT front side wafer processing, the back side of a wafer may be ground and ion implanted with phosphorous or hydrogen to form an N field stop region and with boron to form a P-type hole injection region. A dopant activation process (e.g., annealing) is generally required to remove defects formed during ion implantation and to activate implanted phosphorous impurities to become N-type dopants and implanted boron impurities to become P-type dopants in crystalline silicon.

The activation process may be problematic for structures on the front side of the wafer. In particular, during the back side processes, the temperature at the front side of the wafer may need to remain below 450° C. (or even lower for aluminum only front side metal) to prevent aluminum metal layers from spiking into adjacent silicon and damaging front-side structures, particularly at a P body junction of the IGBT. To keep the front-side temperature low (e.g., below 450° C.), a relatively expensive laser annealing tool may be used. Alternatively, a low temperature furnace annealing, e.g., around 450° C., may be used. However, at this low temperature, only a small fraction of the implanted boron impurities are activated to act as P-type dopants.

It is with respect to these and other deficiencies of the prior art that the present disclosure is provided.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include forming a semiconductor device atop a first main side of a substrate, performing a high-temperature ion implant to a second main side of the substrate, wherein the first main side of the substrate is opposite the second main side of the substrate, and performing a second ion implant to the second main side of the substrate to form a collector layer.

In another aspect, a method may include forming a semiconductor device atop a first main side of a substrate, and performing a high-temperature ion implant to a second main side of the substrate, wherein the first main side of the substrate is opposite the second main side of the substrate. The method may further include performing a second ion implant to the second main side of the substrate to form a collector layer, wherein the second ion implant is performed after the high-temperature ion implant.

In yet another aspect, a method may include forming a semiconductor device atop a first main side of a substrate, and performing a high-temperature ion implant to a second main side of the substrate, wherein the first main side of the substrate is opposite the second main side of the substrate. The method may further include performing a boron ion implant to the second main side of the substrate to form a collector layer, wherein the boron ion implant is performed after the high-temperature ion implant.

BRIEF DESCRIPTION OF THE DRAWINGS

The accompanying drawings illustrate exemplary approaches of the disclosure, including the practical application of the principles thereof, as follows.

Figure 1:
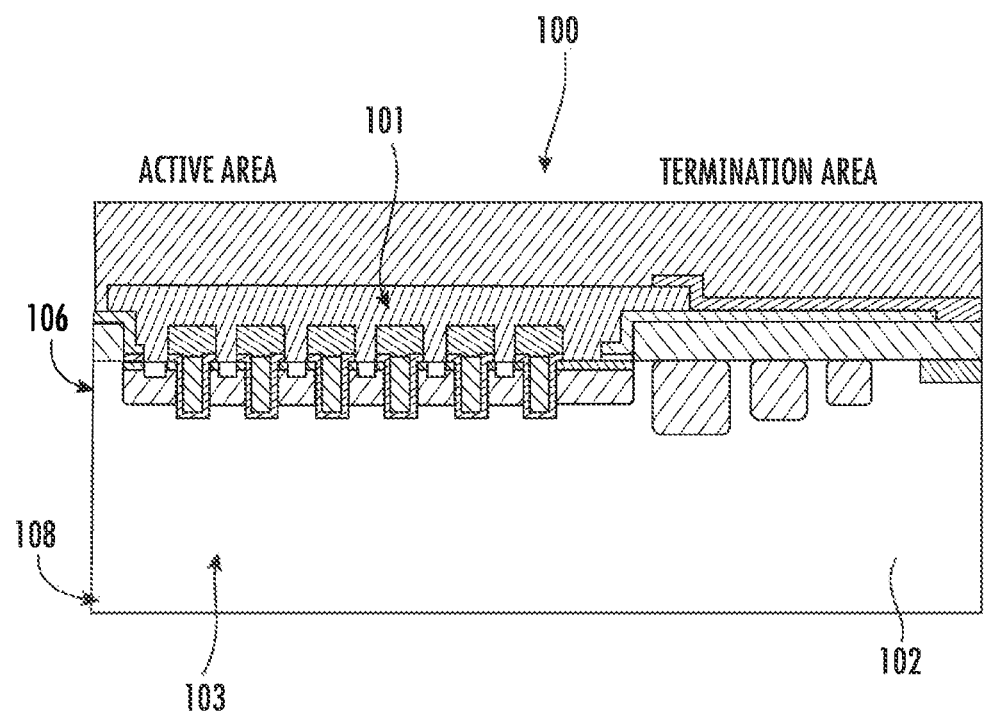
FIG. 1 is a cross-sectional side view of a semiconductor device and substrate, according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, devices, and systems in accordance with the present disclosure will now be described more fully hereinafter with reference to the accompanying drawings, where various embodiments are shown. The methods, devices, and systems may be embodied in many different forms and are not to be construed as being limited to the embodiments set forth herein. Instead, these embodiments are provided so the disclosure will be thorough and complete, and will fully convey the scope of the methods to those skilled in the art.

As mentioned above, backside wafer dopant activation often requires use of a laser spike annealing (LSA) process. However, LSA tools are expensive and hard to maintain. Embodiments herein eliminate the need for LSA by using a high-temperature ("Thermion") ion implantation prior to formation of a collector layer to more completely amorphize silicon of the wafer. In some embodiments, the high-temperature implant (e.g., up to 450° C.) may be with a lighter species, such as helium. The high-temperature ion implant advantageously balances vacancy and bubble damage. Furthermore, a larger Rp of helium implant allows usage of high-current or plasma doping (PLAD), thus improving device throughput.

FIG. 1 is a side cross-sectional view of a semiconductor device structure (hereinafter "device") 100, such as a metal-oxide-semiconductor field-effect transistor (MOSFET) of an insulated gate bipolar transistor (IGBT), according to one or more embodiments described herein. The device 100 may include a plurality of device components 101 formed within/atop a substrate or wafer 102. Although non limiting, the wafer 102 may include a drift layer 103 having N-type dopants to compensate for N-type impurity diffusion from the device components 101.

As shown, the wafer 102 may have a first main side 106, in which the device components 101 are formed, and a second main side 108, opposite the first main side 106. The device components 101 may be formed while the first main side 106 is facing up (in the orientation shown).

Figure 2:
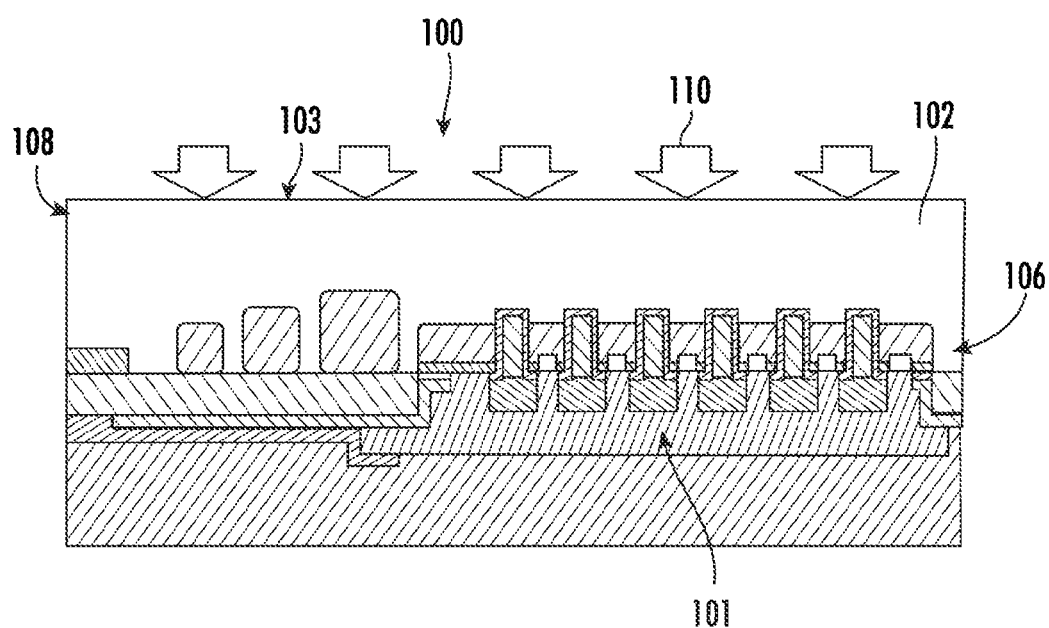
FIG. 2 is a side cross-sectional view illustrating the semiconductor device and substrate following substrate inversion and wafer processing, according to embodiments of the present disclosure.

As shown in FIG. 2, the wafer 102 may be flipped or inverted so the second main side 108 is facing up and the first main side 106 is facing down. The wafer 102 may then be processed to reduce an overall thickness thereof. More specifically, in some embodiments, the second main side 108 of the wafer 102 may receive a grinding or etching process 110 to remove a portion of the wafer 102 to expose a deepest portion of the drift layer 103.

Figure 3:
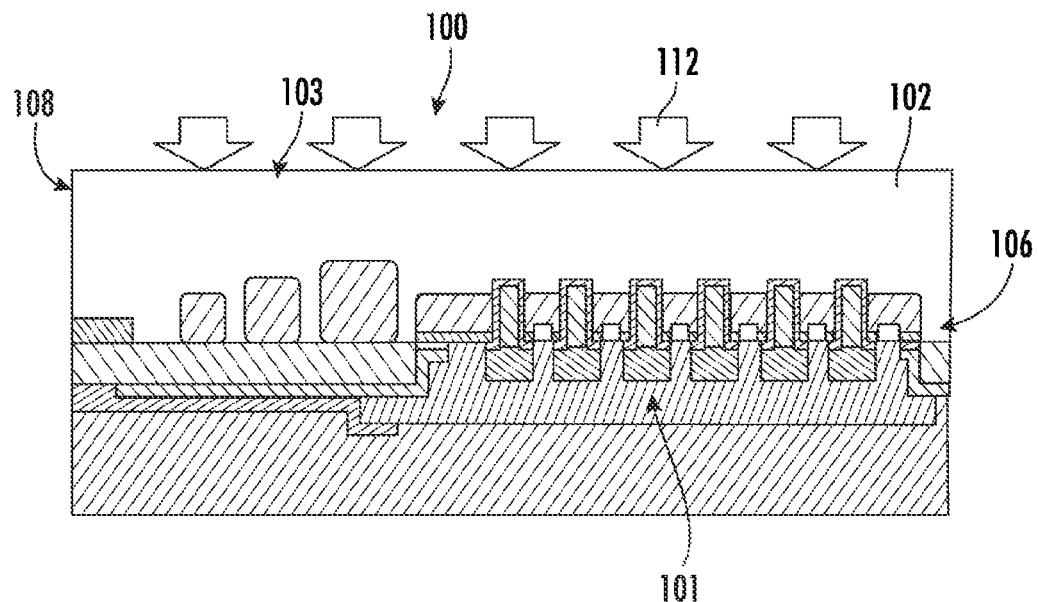
FIG. 3 is a side cross-sectional view illustrating the semiconductor device and substrate during a high-temperature ion implant, according to embodiments of the present disclosure.

As shown in FIG. 3, a high-temperature ion implant 112 may then be performed to the second main side 108 of the wafer 102. For example, the high-temperature ion implant 112 may be performed at temperatures between approximately 150° C. and 450° C. In some embodiments, the high-temperature ion implant 112 may be performed using a Thermion tool at platen temperatures greater than 500° C. As a result, increased activation of a subsequently deposited boron may be achieved.

In some embodiments, the high-temperature ion implant 112 may be a beamline implant delivered at a pre-defined angle, a predefined energy, a predefined dose, etc. For example, the high-temperature ion implant 112 may implant a relatively light species, such as helium. The second main side 108 of the wafer 102 may be implanted until a desired dopant concentration is achieved. In some embodiments, multiple species can be used. Furthermore, the high-temperature ion implant 112 may be performed at an energy less than or equal to approximately 60 KeV. Although non-limiting, the implant angle may be perpendicular, or approximately perpendicular, to a plane defined by the second main side 108 of the wafer 102. The implantation angle may vary in other embodiments.

Figure 4:
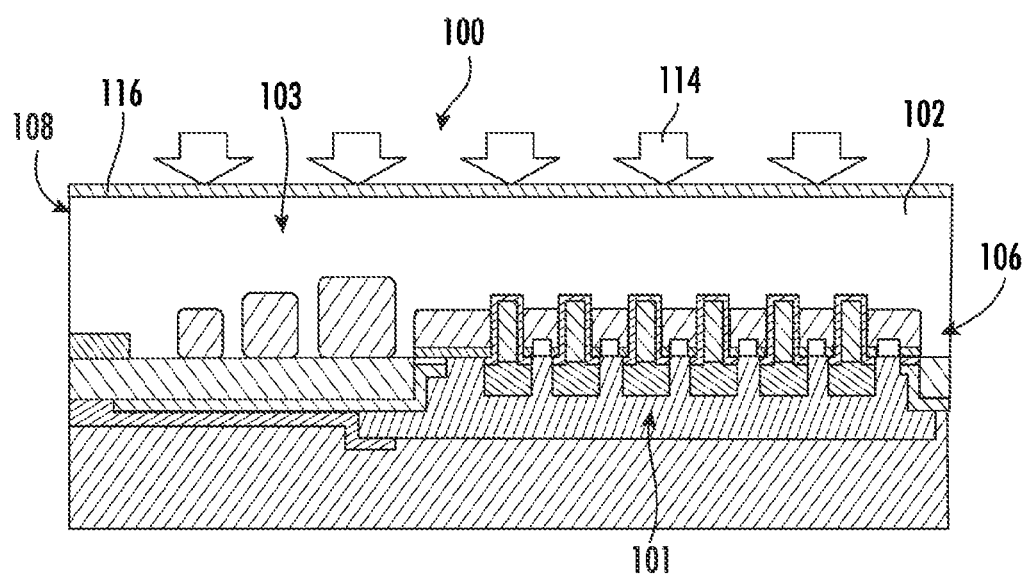
FIG. 4 is a side cross-sectional view illustrating the semiconductor device and substrate during a second ion implant, according to embodiments of the present disclosure.

Next, as shown in FIG. 4, a second ion implant 114 may be performed to the second main side 108 of the wafer 102 to form a collector layer 116 along the second main side 108, wherein the collector layer 116 may be a collector electrode or collector contact. In some embodiments, the second ion implant 114 may be a blanket boron implant with a dose between 1e13 cm$^{-2}$ and 5e15 cm$^{-2}$. Furthermore, the second ion implant 114 may be performed at room temperature and with an energy of approximately 30-50 KeV. Embodiments herein are not limited in this context.

Figure 5:
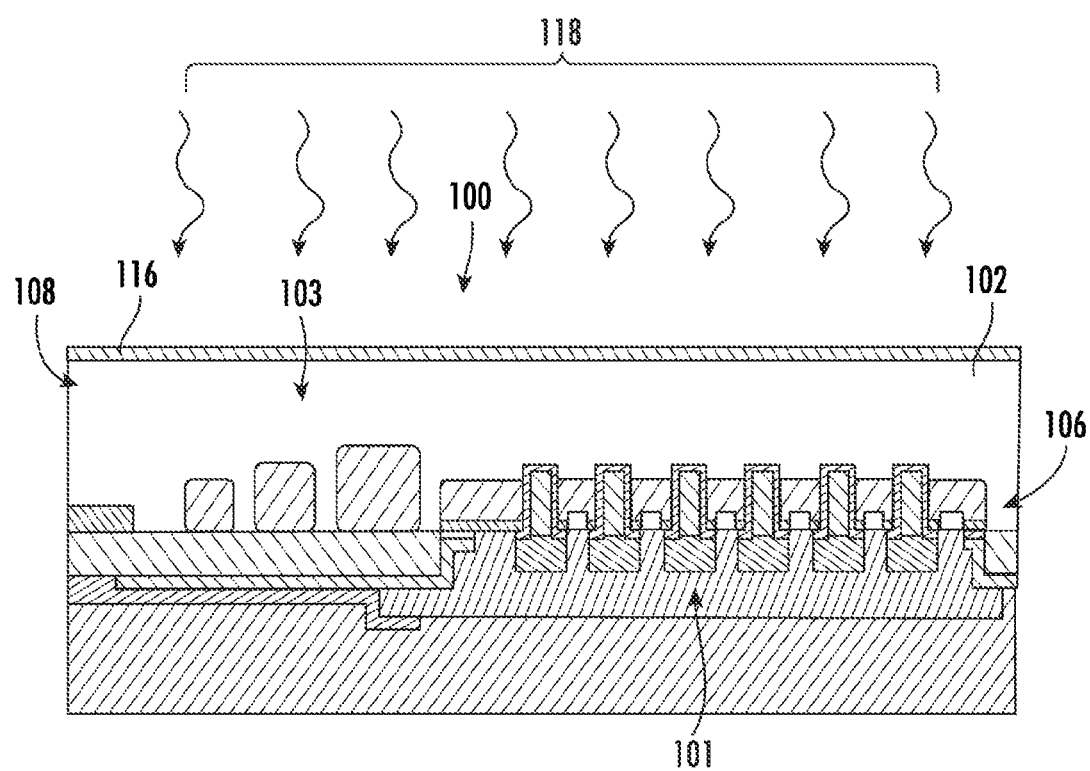
FIG. 5 is a side cross-sectional view illustrating the semiconductor device and substrate during an annealing process, according to embodiments of the present disclosure.

Next, as shown in FIG. 5, an annealing process 118 may be performed to the device 100. In some embodiments, the annealing process 118 may be a relatively lower furnace anneal (e.g., below 450° C.). Advantageously, no LSA is required to activate dopants in the device 100.

Figure 6:
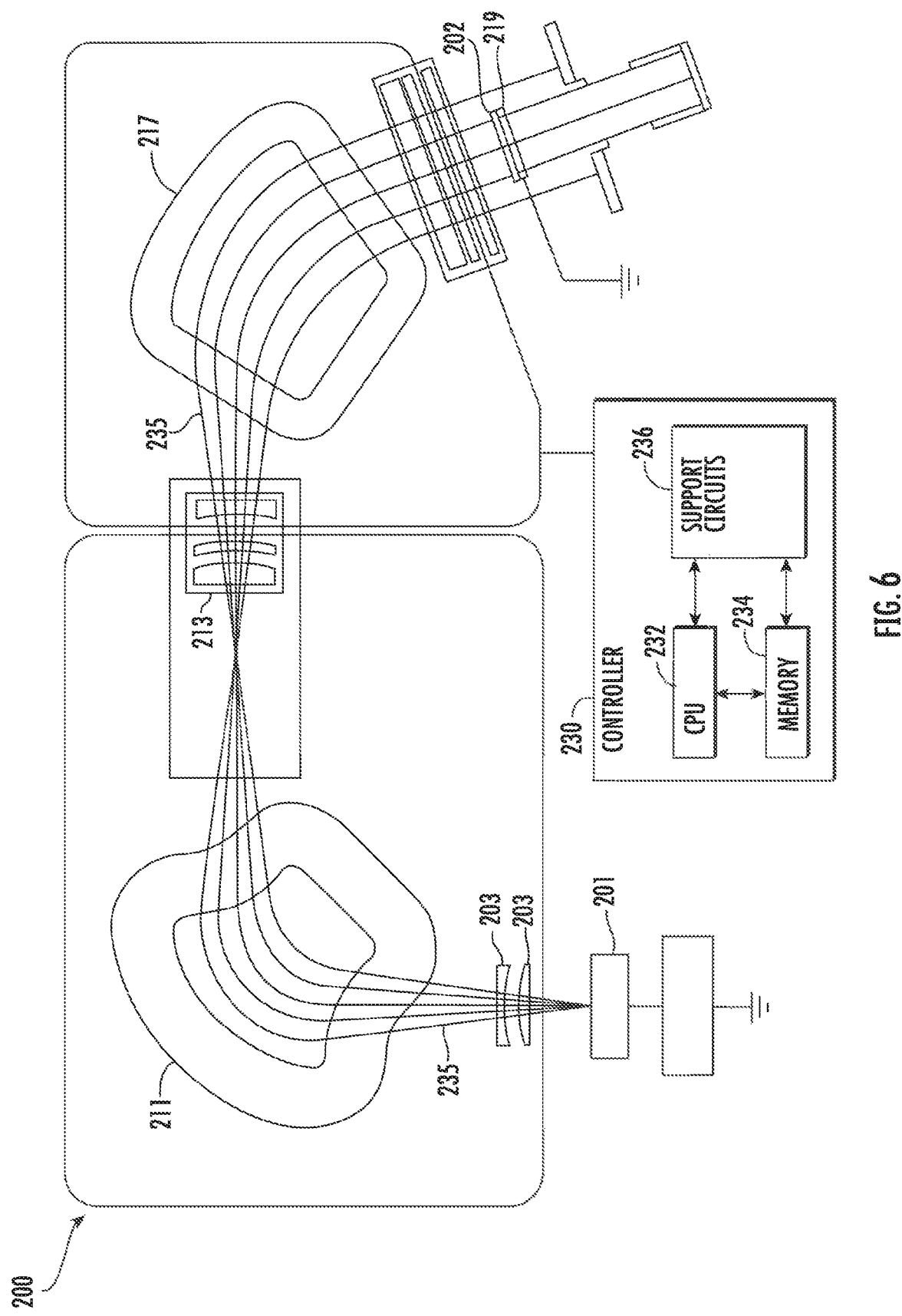
FIG. 6 illustrates a schematic diagram of a processing apparatus according to embodiments of the present disclosure.

FIG. 6 illustrates a schematic diagram of a processing apparatus 200 useful to perform processes described herein. One example of a beam-line ion implantation processing apparatus is the Varian VIISTA® Trident, available from Applied Materials Inc., Santa Clara, Calif. The processing apparatus 200 may include an ion source 201 for generating ions. For example, the ion source 201 may provide an ion implant, such as the high-temperature ion implant 112 demonstrated in FIG. 3 and/or the second ion implant 114 demonstrated in FIG. 4. The ion source 201 may also provide an ion etch, such as the etching process 110 of FIG. 2 to remove a portion of the wafer 102. The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 (wafer) to be processed. The substrate 202 may be the same as the substrate/wafer 102 described above. The substrate 202 may be moved in one or more dimensions (e.g. translate, rotate, tilt, etc.) by a component sometimes referred to as a "roplat" (not shown). It is also contemplated that the processing apparatus 200 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

The memory 234 is in the form of computer-readable storage media that contains instructions, that when executed by the CPU 232, facilitates the operation of the apparatus 200. The instructions in the memory 234 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
   forming a semiconductor device atop a first main side of a substrate;
   performing a first ion implant to a second main side of the substrate while a platen supporting the substrate is at a high-temperature, wherein the first main side of the substrate is opposite the second main side of the substrate;
   performing a second ion implant to the second main side of the substrate to form a collector layer, wherein the second ion implant is performed immediately following the first ion implant, and wherein the collector layer is a collector electrode; and
   annealing the semiconductor device and the substrate following formation of the collector electrode using a furnace annealing process at a temperature less than 450° C.

2. The method of claim 1, wherein the second ion implant is a boron ion implant.

3. The method of claim 1, wherein the first ion implant is performed at a temperature greater than 300° Celsius.

4. The method of claim 1, wherein the first ion implant is performed at a temperature greater than 400° Celsius.

5. The method of claim 1, further comprising inverting the substrate after the semiconductor device is formed atop the first main side of the substrate.

6. The method of claim 5, further comprising processing the second main side of the substrate after the substrate is inverted, wherein the first ion implant is performed after the second main side of the substrate is processed.

7. The method of claim 6, wherein the second main side of the substrate is processed by removing a portion of the substrate along the second main side of the substrate.

8. The method of claim 1, wherein the first ion implant is a helium implant performed at an implant energy less than or equal to 60 KeV.

9. The method of claim 1, wherein the semiconductor device comprises an insulated-gate bipolar transistor along the first main side of the substrate.

10. A method, comprising:
    forming a semiconductor device atop a first main side of a substrate;
    performing a first ion implant to a second main side of the substrate while a platen supporting the substrate is at a high-temperature, wherein the first main side of the substrate is opposite the second main side of the substrate;
    performing a second ion implant to the second main side of the substrate to form a collector layer, wherein the second ion implant is performed immediately after the first ion implant, and wherein the collector layer is a collector electrode; and
    annealing the semiconductor device and the substrate following formation of the collector electrode using a furnace annealing process at a temperature less than 450° C.

11. The method of claim 10, wherein the second ion implant is a boron ion implant.

12. The method of claim 10, wherein the first ion implant is performed at a temperature greater than 300° Celsius.

13. The method of claim 10, further comprising inverting the substrate prior to performing the first ion implant.

14. The method of claim 13, further comprising removing a portion of the substrate along the second main side of the substrate after the substrate is inverted.

15. The method of claim 10, wherein the first ion implant comprises implanting helium at an implant energy less than or equal to 60 KeV.

16. The method of claim 10, wherein the semiconductor device comprises an insulated-gate bipolar transistor along the first main side of the substrate.

17. A wafer backside dopant activation method, comprising:
    forming a semiconductor device atop a first main side of a substrate;
    inverting the substrate;
    performing a first ion implant to a second main side of the substrate after the substrate is inverted and while a platen supporting the substrate is at a high-temperature, wherein the first main side of the substrate is opposite the second main side of the substrate;
    performing a boron ion implant to the second main side of the substrate to form a collector layer, wherein the boron ion implant is performed immediately after the first ion implant, and wherein the collector layer is a collector electrode; and
    annealing the semiconductor device and the substrate following formation of the collector electrode using a furnace annealing process at a temperature less than 450° C.

18. The wafer backside dopant activation method of claim 17, wherein the first ion implant comprises implanting helium at an implant energy less than or equal to 60 KeV, and wherein the first ion implant is performed at a temperature greater than 300° Celsius.

* * * * *